(12) United States Patent
Celella et al.

(10) Patent No.: US 7,479,043 B2
(45) Date of Patent: Jan. 20, 2009

(54) TARGETED COMPENSATION IN TELECOMMUNICATIONS CONNECTORS

(75) Inventors: Brian Celella, Southington, CT (US); Daniel J. Mullin, Plantsville, CT (US)

(73) Assignee: The Siemon Company, Watertown, CT (US)

(*) Notice: Subject to any disclaimer, the term of this patent is extended or adjusted under 35 U.S.C. 154(b) by 0 days.

(21) Appl. No.: 11/745,724

(22) Filed: May 8, 2007

(65) Prior Publication Data

US 2007/0259572 A1 Nov. 8, 2007

Related U.S. Application Data

(60) Provisional application No. 60/798,785, filed on May 8, 2006.

(51) Int. Cl.
*H01R 24/00* (2006.01)
(52) U.S. Cl. ........................ 439/676; 439/941
(58) Field of Classification Search ................. 439/676, 439/941
See application file for complete search history.

(56) References Cited

U.S. PATENT DOCUMENTS

| 5,997,358 | A | 12/1999 | Adriaenssens et al. | |
| 7,153,168 | B2 | 12/2006 | Caveney et al. | |
| 7,154,049 | B2 | 12/2006 | Celella et al. | |
| 7,179,131 | B2 | 2/2007 | Caveney et al. | |
| 2005/0181676 | A1* | 8/2005 | Caveney et al. | 439/676 |
| 2006/0134992 | A1* | 6/2006 | Green et al. | 439/676 |
| 2007/0015414 | A1* | 1/2007 | Denovich et al. | 439/676 |
| 2007/0015417 | A1* | 1/2007 | Caveney et al. | 439/676 |
| 2007/0173120 | A1 | 7/2007 | Caveney et al. | |
| 2007/0259571 | A1* | 11/2007 | Chen | 439/676 |

* cited by examiner

Primary Examiner—Ross N Gushi
(74) Attorney, Agent, or Firm—Cantor Colburn LLP

(57) ABSTRACT

A telecommunications connector includes a plug having plug contacts; an outlet having outlet contacts, the plug contacts making physical and electrical contact with the outlet contacts on a top surface of the outlet contacts; a compensation contact positioned beneath a bottom surface of the outlet contacts, the compensation contact being proximate to a location where the plug contacts make physical contact with the outlet contacts, the compensation contact providing crosstalk compensation for the telecommunications connector.

11 Claims, 7 Drawing Sheets

TARGETED COMPENSATION IN TELECOMMUNICATIONS CONNECTORS

CROSS REFERENCE TO RELATED APPLICATIONS

This application claims the benefit of U.S. provisional patent application 60/798,785, filed May 8, 2006, the entire contents of which are incorporated herein by reference.

BACKGROUND

This application is related to U.S. patent application Ser. No. 10/716,808, the entire contents of which are incorporated herein by reference.

Embodiments of the invention relate to improving NEXT, FEXT, balance (TCl, TCTL) and return loss in terms of magnitude and upper frequency limits of transmission components and products. Embodiments of the invention are techniques used to apply compensation at the point of the NEXT noise sources. Standard compensating techniques involving inductive and capacitive coupling to cancel crosstalk (NEXT or FEXT) can only achieve limited success due to the limits defined by the TIA and IEC in terms of the magnitude and phase for both NEXT and FEXT of qualification plugs. In addition, standard compensation techniques are usually applied away from the outlet/plug interface which is the major contributor to crosstalk. As performance requirements are pushed beyond 100 and 250 MHz up to and above 500 MHz, canceling the crosstalk at the source becomes more critical. ANSI/TIA/EIA-568-B.2-1 is represented in Table 1 below defines the magnitude and phase requirements for category 6 test plugs. As an example, the TIA specifies the case 1 plug to have a specified magnitude (36.4 at 100 MHz) and phase $-90 \pm 1.5 * f/100$. The component/connector design (outlet/PCB and cable termination area) must cancel this. In essence it must have the same magnitude of NEXT, but opposite phase, +90 degrees as shown in FIG. 1.

In reality it is difficult to match this phase perfectly. To match perfectly, one can imagine folding the plot in FIG. 1 in half, the +90 and −90 lines would fall on each other and cancel each other out.

In a perfect match, where magnitude and phase are equivalent and applied at the point of the NEXT source, the resulting NEXT is at the noise floor, virtually nonexistent. FIG. 2 shows the plug/outlet interface 10 and the PCB/cable termination area 12. A plug 14 is mated with an outlet 16 mounted to PCB 18. A connecting block 20 is mounted to the PCB 18 as known in the art. Signals travel along a path including plug 14, outlet 16, PCB 18 and connecting block 20 at which cables are terminated. If we consider the outlet/plug area 10 as the primary offending crosstalk contributor, the PCB/cable termination area 18 typically compensates for this offending crosstalk.

In most existing design implementations, the compensating crosstalk cannot be added/applied at the point of origin, that is the plug/outlet interface 10. Typically, compensating crosstalk is added on the PCB and cable termination area 12. Unfortunately, it is difficult, if not impossible, to replicate the exact magnitude and phase of the offending crosstalk throughout the frequency range. There is a phase shift due to the distance from the plug/outlet interface 10 to where the compensating crosstalk is applied. It should be noted, the geometry and location of the outlet contacts that go from the outlet/plug interface 10 to the PCB (or outlet to connecting block in a lead frame design) may affect the magnitude and phase of the offending crosstalk. Therefore, the PCB 18, cable termination area and connecting block 20 or other termination must compensate for what remains. It must also compensate when tested in both directions. In addition, the TIA and IEC specify a range of performance for the modular plugs which directly contribute to the offending crosstalk.

If we assume the magnitudes are equal for the crosstalk at the plug/outlet interface and the compensation on the PCB/cable termination area, but out of phase, we get a non-category 6 compliant response as shown in the 0 picosecond delay plot of FIG. 3. By shifting the phase via manipulating the delay as shown in FIG. 4, we can extend the upper frequency performance of the design without manipulating the magnitude. The key is to create the null at an area where it pulls the performance down, below the specified limit line. FIGS. 3 and 4 show the affect of varying the delay in 20 ps intervals. The null occurs at a frequency where magnitude and phase are equal.

SUMMARY

Embodiments of the invention include a telecommunications connector including a plug having plug contacts; an outlet having outlet contacts, the plug contacts making physical and electrical contact with the outlet contacts on a top surface of the outlet contacts; a compensation contact positioned beneath a bottom surface of the outlet contacts, the compensation contact being proximate to a location where the plug contacts make physical contact with the outlet contacts, the compensation contact providing crosstalk compensation for the telecommunications connector.

DETAILED DESCRIPTION

Embodiments of the invention involve methods of compensating at the plug contact and outlet contact interface to remove the distance/delay involved in applying the compensation somewhere else on the printed circuit board (PCB) or lead frame portion of the connector.

Figure 1:
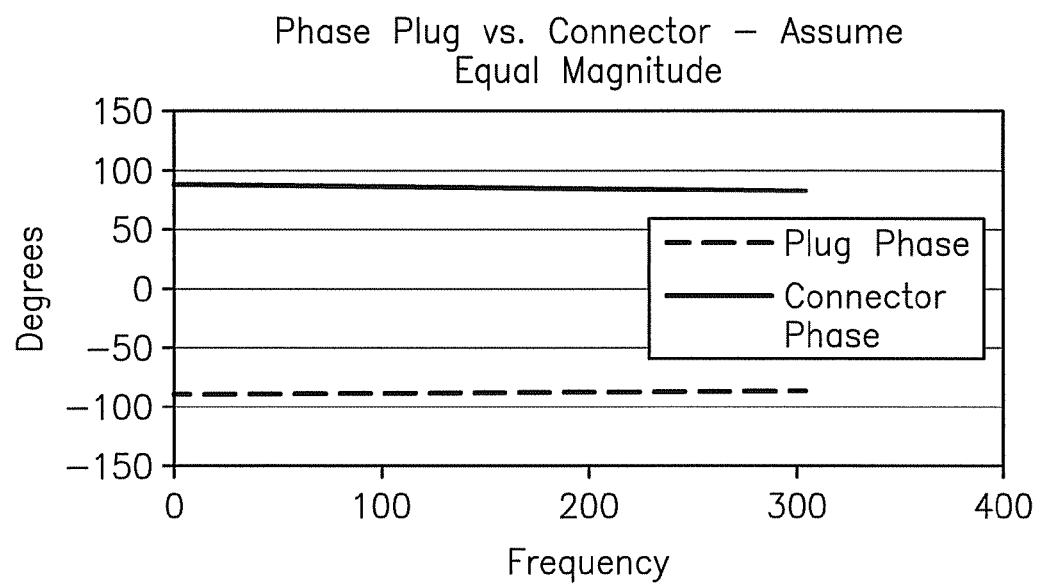
FIG. 1 illustrates plug phase and connector phase for ideal cancellation of crosstalk.
Figure 2:
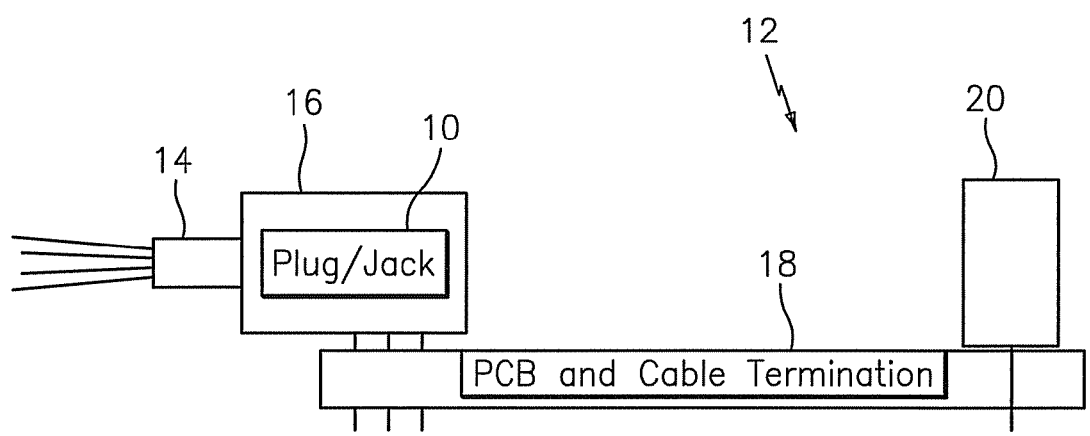
FIG. 2 illustrates a conventional plug/outlet interface.
Figure 3:
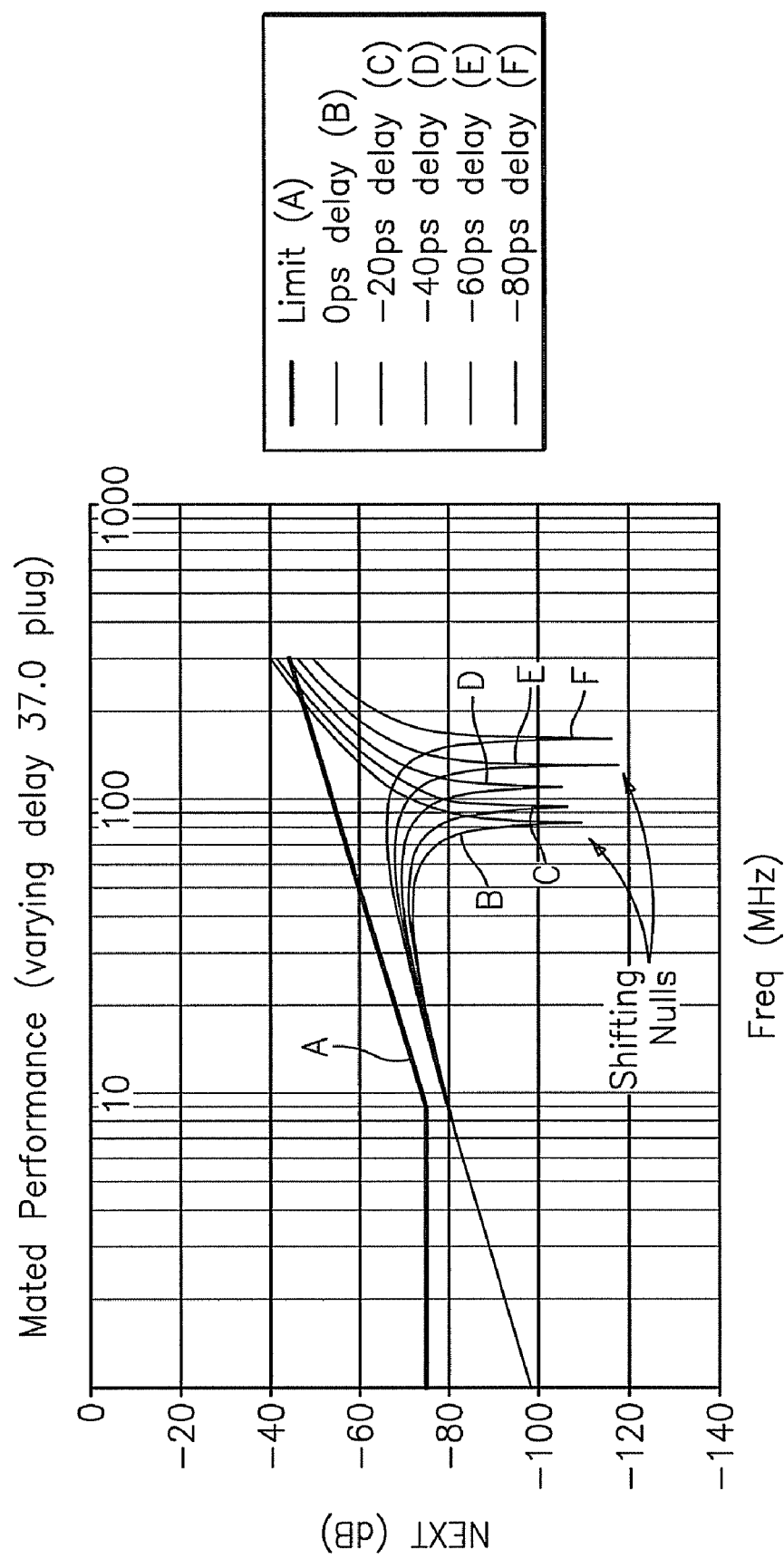
FIG. 3 is plot of crosstalk versus frequency for different delay values.
Figure 4:
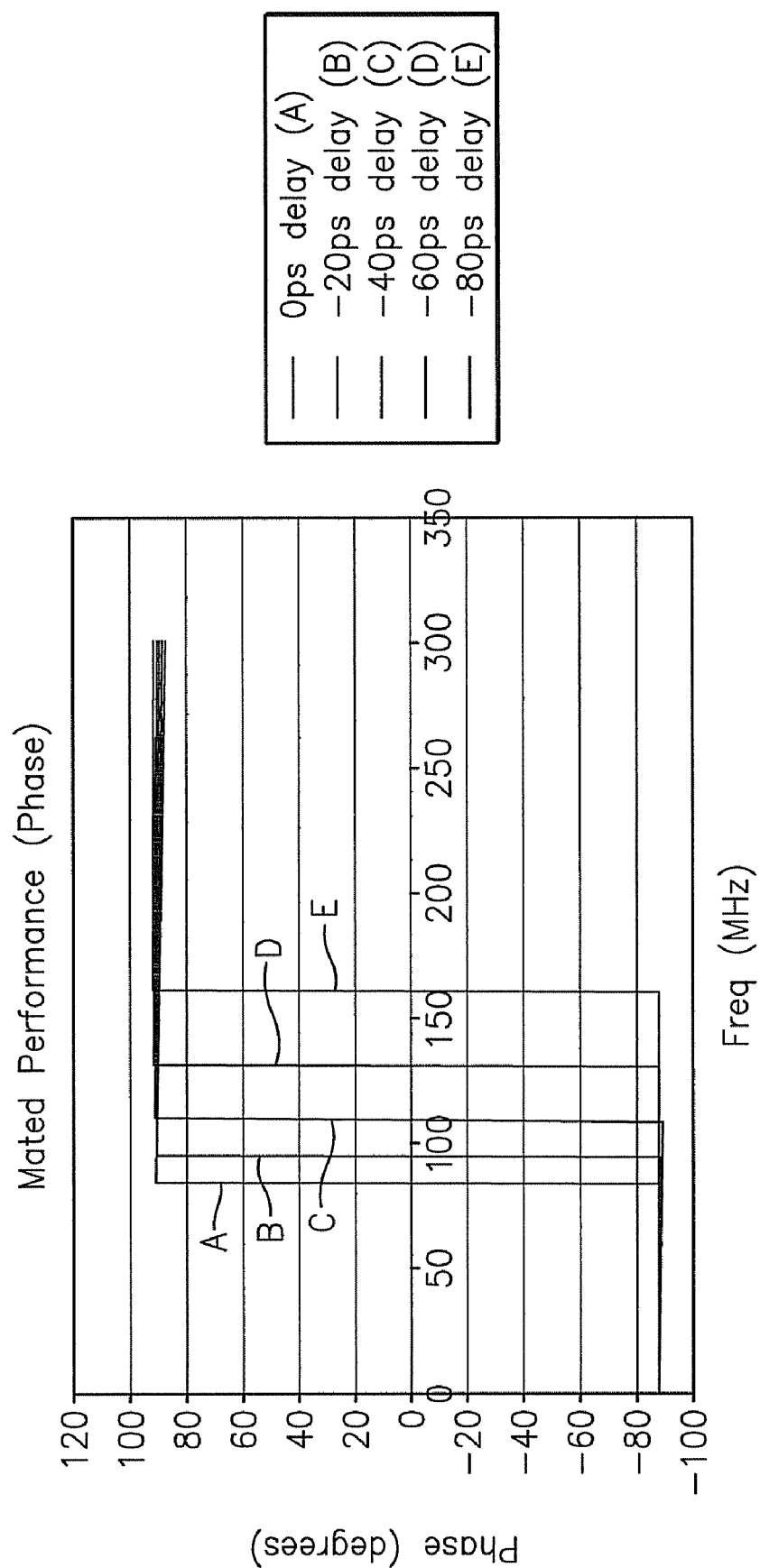
FIG. 4 is a plot of phase versus frequency for different delay values.
Figure 5:
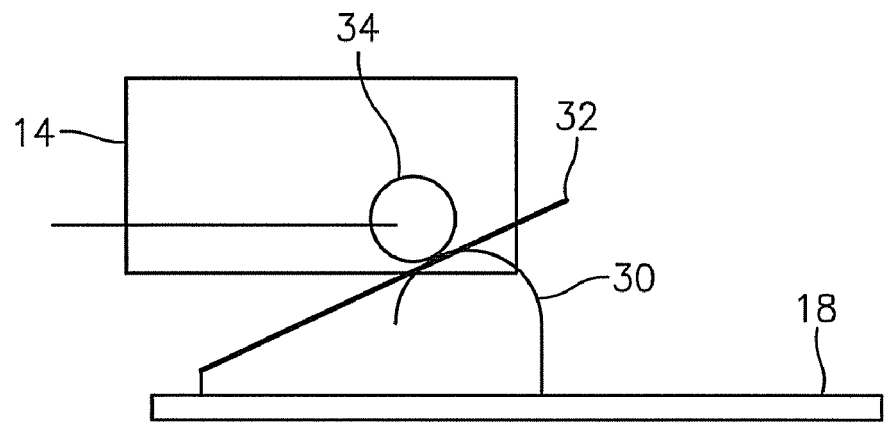
FIG. 5 illustrates a plug/outlet interface in an embodiment of the invention.

FIG. 5 illustrates a first embodiment using one or more spring type compensation contacts 30 emanating from PCB 18 below the point where a plug contact 34 in plug 14 makes electrical contact with an outlet contact 32. The spring type contact 30 rises from the PCB towards the back of the outlet and bends towards the front of the outlet 14. The spring contacts 30 are positioned beneath the outlet contacts 32, whereas the plug contacts 34 contact the top of outlet contacts 32. Electrical components for providing compensating crosstalk are connected to spring contacts 30.

The spring contacts 30 can be used on each contact 32 of the outlet 16 that needs compensation. The spring contacts 30 can be staggered to prevent coupling from one to the other. The spring contacts can rise from the pcb towards the back of the outlet. The spring contacts 30 are in electrical connection with PCB 18 and may be coupled to compensation traces or regions on the PCB. Placing spring contact 30 at the location where the plug contact 34 makes physical contact with the outlet contact 32 locates the compensation components close to the plug/outlet interface. This helps to control phase of the compensation as well.

In alternate embodiments, the spring contact 30 is insulated and interacts with the outlet contact 32 through reactance (inductance and/or capacitance). In these embodiments, the spring contact 30 provides compensation by virtue of its location proximate the plug/outlet interface and its electrical properties. In these embodiments, additional compensation may not be needed on the printed circuit board 18 as the compensation contact 30 provides the necessary compensation without the need for additional compensation elements such as traces or discrete components on the printed circuit board.

Figure 6:
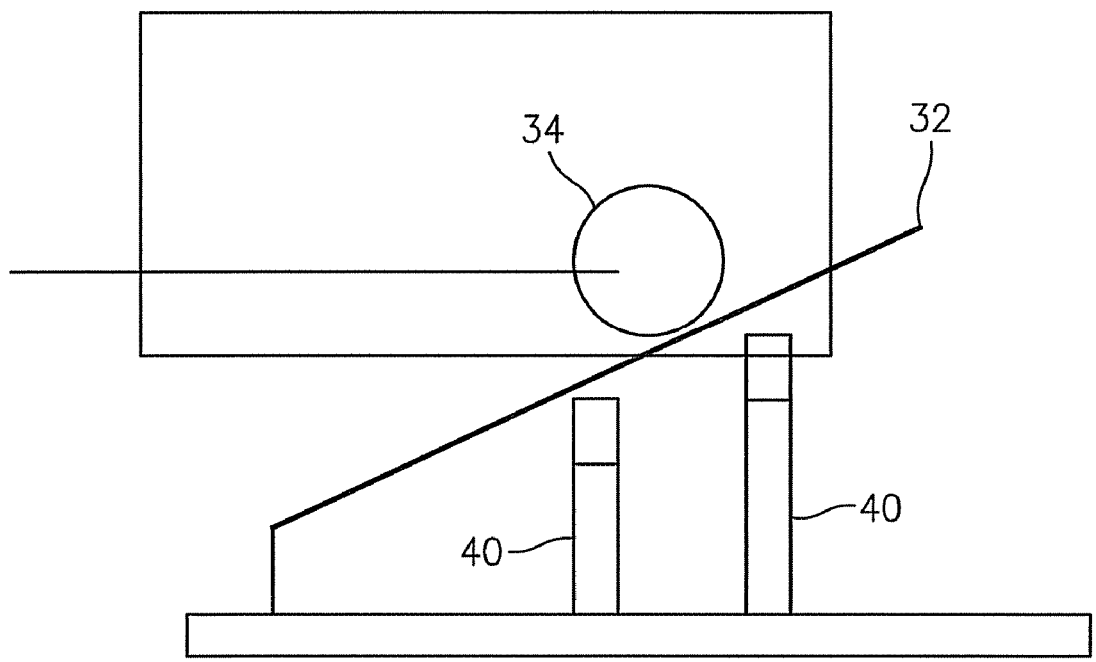
FIG. 6 illustrates a plug/outlet interface in an alternate embodiment of the invention.

FIG. 6 shows an alternate embodiment where one or more spring loaded, pogo pin-type compensation contacts 40 are used to make electrical contact with outlet contacts 32. The pogo pin-type contacts 40 are positioned beneath the outlet contacts 32, whereas the plug contacts 34 contact the top of outlet contacts 32. Electrical components for providing compensating crosstalk are connected to contacts 40. For example, PCB 18 may include traces, discrete components, embedded components, etc., for compensating crosstalk. Placing contacts 40 at the location where the plug contact 34 makes physical contact with the outlet contact 32 locates the compensation components close to the plug/outlet interface. This helps to control phase of the compensation as well.

In alternate embodiments, the pogo pin-type contact 40 is insulated and interacts with the outlet contact 32 through reactance (inductance and/or capacitance). In these embodiments, the pogo pin-type contact 40 provides compensation by virtue of its location proximate the plug/outlet interface and its electrical properties. In these embodiments, additional compensation may not be needed on the printed circuit board 18 as the compensation contact 40 provides the necessary compensation without the need for additional compensation elements such as traces or discrete components on the printed circuit board.

With the compensation contact in place, compensation techniques known to the industry can be utilized by connecting to the compensation contact base. Both contacts 30 and 40 may use spring force to maintain electrical contact with outlet contacts 32. Alternatively, contacts 30 and 40 can be insulated contacts that provide compensation from inductive and/or capacitive coupling to a specific pair. At the base of contacts 30 and 40 they would be connected to a contact directly and also with compensation techniques applied at the PCB or lead frame level as known in the industry.

Figure 7:
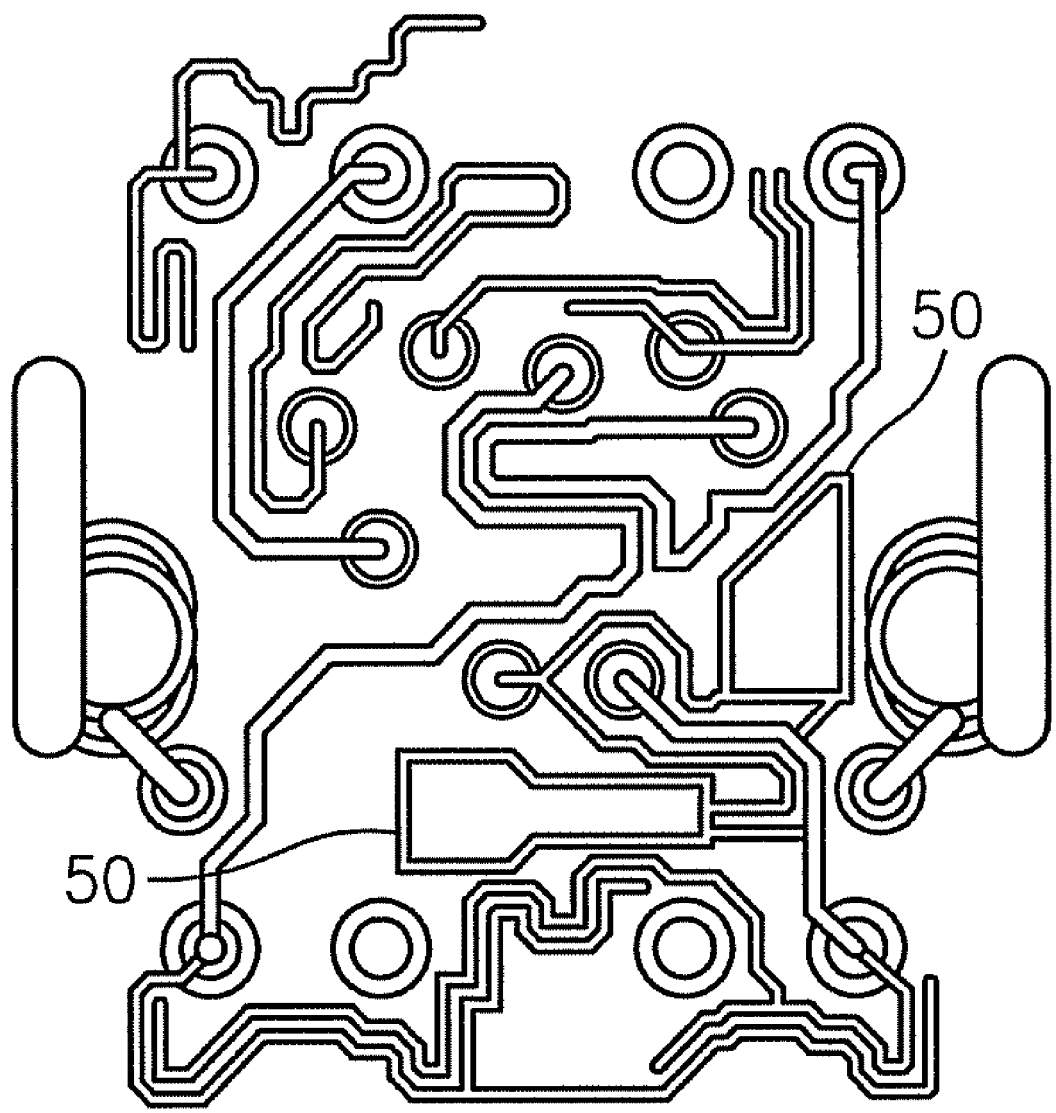
FIG. 7 illustrates a printed circuit board in an exemplary embodiment of the invention.

FIG. 7 shows a printed circuit board having regions 50 of embedded capacitance, inductance and/or resistance to provide compensation. Exiting designs such as that disclosed in U.S. patent application Ser. No. 10/716,808 use traces on the PCB to provide compensation. Embodiments of this invention replace the area-intensive trace coupling technique by having an embedded capacitor, resistor and/or inductor 50 at or near the area of interest such as the base of an outlet contact. The embedded capacitor, resistor and/or inductor is formed using techniques known in the art and are used and designed to apply appropriate compensation locally avoiding issues caused by the delay associated with the added length of the compensation traces.

Figure 9:
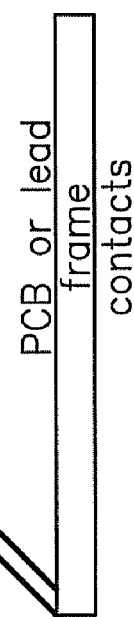
FIG. 9 illustrates outlet contacts in an exemplary embodiment of the invention.
Figure 8:
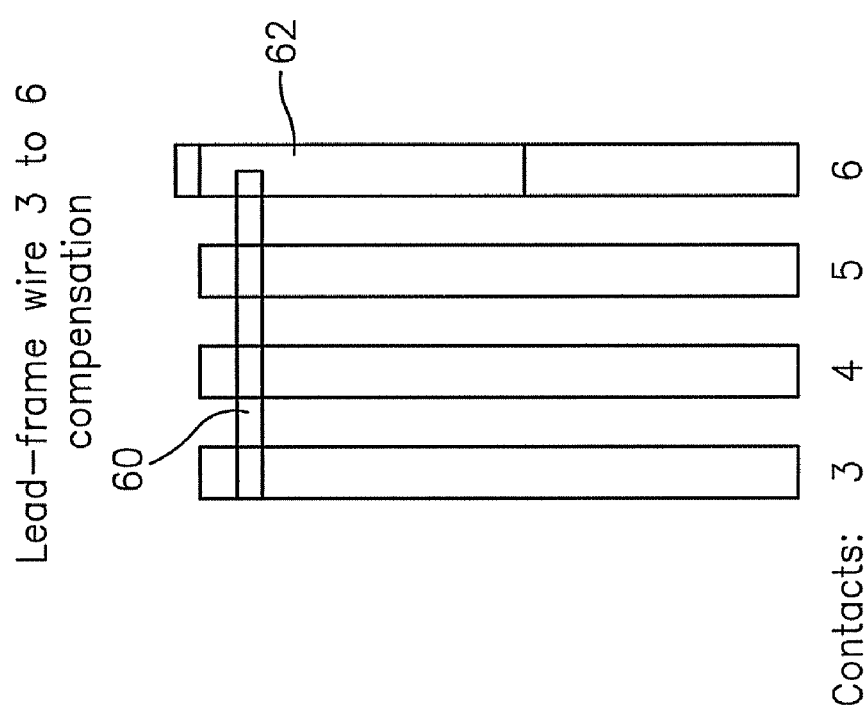
FIG. 8 illustrates outlet contacts in an exemplary embodiment of the invention.

FIGS. 8 and 9 show outlet contacts in another embodiment of the invention. Four lead frame type contacts or stamped contacts are shown in FIG. 8. Only four contacts are shown for illustration and it is understood that additional contacts may be used. In FIG. 8, contacts 3 and 6 form a tip and ring pair and contacts 4 and 5 form a tip and ring pair. A distal end of contact 3 extends down towards the PCB and includes an extension 60 that passes under contacts 4 and 5 to contact 6 where an arm 62 extends for a predetermined length parallel to contact 6 to apply the appropriate crosstalk compensation. The spacing between arm 62 and contact 6 is controlled via an insulative plastic spacer or comb 64. Alternatively, the underside of contact 6 has an insulated covering which allows arm 62 to run directly underneath (no space) contact 6. FIG. 9 is a side view illustrating the contacts from FIG. 8. Placing the arm 62 near the location where the plug contacts make contact with the outlet contacts helps to control phase of the compensation as well.

Figure 10:
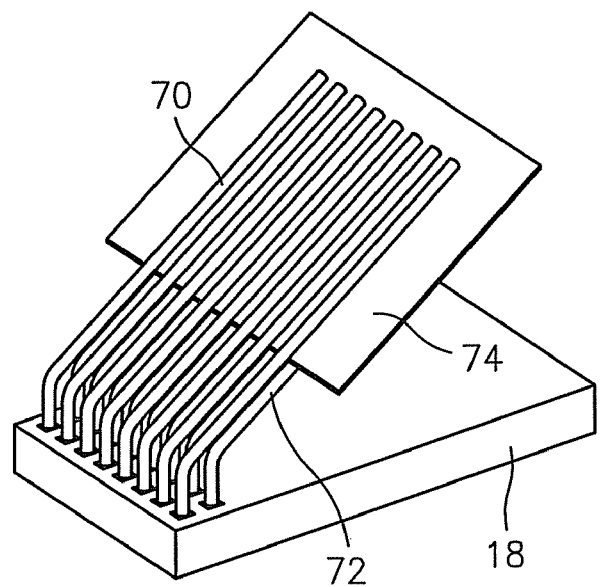
FIG. 10 illustrates outlet contacts in an exemplary embodiment of the invention.
Figure 11:
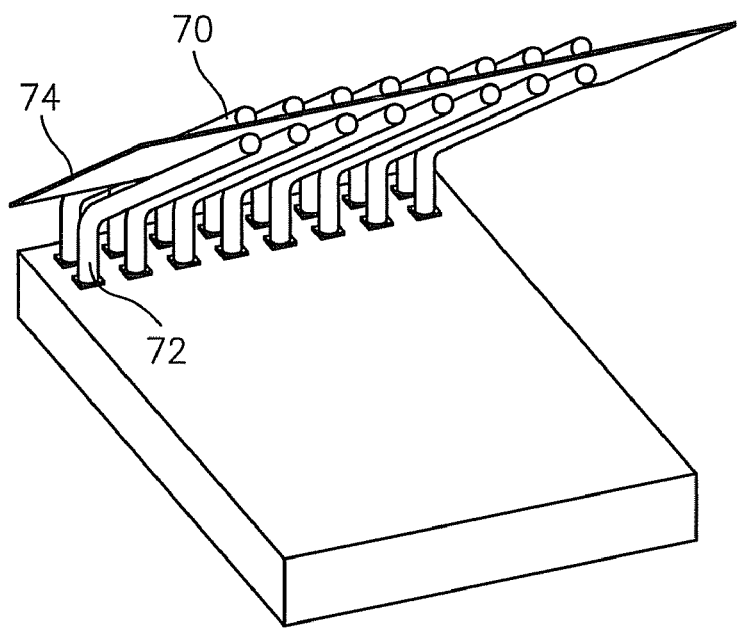
FIG. 11 illustrates outlet contacts in an exemplary embodiment of the invention.

FIGS. 10 and 11 are perspective views of outlet contacts in an alternate embodiment. In this embodiment, the outlet includes a first set of contacts 70 positioned above a second set of contacts 72, with an insulative sheet 74 positioned between the two sets of contacts. The upper contacts 70 make electrical contact with the plug contacts as known in the art. The second set of contacts 72 are used to provide compensation between contacts by introducing capacitance and/or inductance between contacts as desired. This configuration moves compensation to the plug-outlet interface area to reduce the effects of phase delay as discussed above. Alternatively, contacts 72 can be insulated and run directly underneath contacts 70. They can be in direct contact or the distance can be controlled by an insulative sheet or plastic holder. The spacing as well as the material and thickness on the insulated contact are controlled to apply the appropriate amount of capacitive and/or inductive compensation. Placing the contacts 72 beneath contacts 70 near the location where the plug contacts make contact with the outlet contacts 70 helps to control phase of the compensation as well.

Embodiments provide key tools and concepts necessary for maximizing electrical transmission performance of various types of connecting hardware and printed circuit technologies. Connecting hardware can include modular outlets and plugs, printed circuit boards (PCBs), connecting blocks, various wire connecting devices to printed circuit boards and any combination of such items. These printed circuit technologies must comply with minimum transmission performance requirements specified by various industry standards. Standards such as International Electrotechnical Commission (IEC) IEC 60603-7-2 or -6, ANSI/TIA/EIA-568-B-2, ISO/IEC 11801, IEEE, etc. Parameters include but are not limited to, near end crosstalk (NEXT), return loss, insertion loss, and far end crosstalk (FEXT). The validation of category 5, 5e, 6 and 7 are strictly controlled and described in the appropriate ANSI/TIA/EIA and IEC standards. In the case of category 5e, 6 and 7 the validation is required to be performed with a strict set of validation test plugs. The performance is defined by the magnitude and phase of both the NEXT and FEXT for each pair combination Table 1 shows the required ANSI/TIA/EIA category 6-plug range. The described design tools/features are used to create products that satisfy the performance requirements of these various specifications under the requirements detailed in the respective documents. The techniques described are used to accomplish these requirements and to ensure repeatable performance in limit spaces.

TABLE 1

| Case # | Pair combination | Limit | NEXT loss magnitude limit[1),4),5)] | NEXT loss phase limit[2),3)] |
|---|---|---|---|---|
| Case 1 | 3,6-4,5 | Low | ≦36.4-20log(f/100) | (−90 + 1.5 · f/100) ± f/100 |
| Case 2 | 3,6-4,5 | Central | (37.0 ± 0.2)-20log(f/100) | (−90 + 1.5 · f/100) ± f/100 |
| Case 3 | 3,6-4,5 | High | ≧37.6-20log(f/100) | (−90 + 1.5 · f/100) ± f/100 |
| Case 4 | 1,2-3,6 | Low | ≦46.5-20log(f/100) | (−90 + 1.5 · f/100) ± 3f/100 |
| Case 5 | 1,2-3,6 | High | ≧49.5-20log(f/100) | (−90 + 1.5 · f/100) ± 3f/100 |
| Case 6 | 3,6-7,8 | Low | ≦46.5-20log(f/100) | (−90 + 1.5 · f/100) ± 3f/100 |
| Case 7 | 3,6-7,8 | High | ≧49.5-20log(f/100) | (−90 + 1.5 · f/100) ± 3f/100 |
| Case 8 | 1,2-4,5 | Low | ≦57-20log(f/100) | 90 ± (30 · f/100) |
| Case 9 | 1,2-4,5 | High | ≧70-20log(f/100) | any phase |
| Case 10 | 4,5-7,8 | Low | ≦57-20log(f/100) | 90 ± (30 · f/100) |
| Case 11 | 4,5-7,8 | High | ≧70-20log(f/100) | any phase |
| Case 12 | 1,2-7,8 | Low | ≦60-20log(f/100) | any phase |

[1)]Magnitude limits apply over the frequency range from 10 MHz to 250 MHz.
[2)]Phase limits apply over the frequency range from 50 MHz to 250 MHz.
[3)]When the measured plug NEXT loss is greater than 70 dB, the phase limit does not apply.
[4)]When a low limit NEXT loss calculation results in values greater than 70 dB, there shall be no low limit for NEXT loss.
[5)]When a high limit NEXT loss calculation results in values greater than 70 dB, the high limit NEXT shall revert to a limit of 70 dB.

While the invention has been described with reference to exemplary embodiments, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiments disclosed for carrying out this invention.

What is claimed is:

1. A telecommunications connector comprising:
a plug having plug contacts;
an outlet having outlet contacts, the plug contacts making physical and electrical contact with the outlet contacts on a top surface of the outlet contacts;
a compensation contact positioned beneath a bottom surface of the outlet contacts, the compensation contact being proximate to a location where the plug contacts make physical contact with the outlet contacts, the compensation contact providing crosstalk compensation for the telecommunications connector;
the outlet contacts and the compensation contact are physically supported on a printed circuit board in the outlet;
wherein the compensation contact is a spring contact having one end secured to the printed circuit board and a second end in physical contact with an outlet contact.

2. The telecommunications connector of claim 1 wherein:
the printed circuit board has an embedded component for compensating crosstalk in the telecommunications connector.

3. The telecommunications connector of claim 2 wherein:
the embedded component is at least one of resistance, capacitance and inductance.

4. A telecommunications connector comprising:
a plug having plug contacts;
an outlet having outlet contacts, the plug contacts making physical and electrical contact with the outlet contacts on a top surface of the outlet contacts;
a compensation contact positioned beneath a bottom surface of the outlet contacts, the compensation contact being proximate to a location where the plug contacts make physical contact with the outlet contacts, the compensation contact providing crosstalk compensation for the telecommunications connector;
wherein the outlet contacts and the compensation contact are physically supported on a printed circuit board in the outlet;
wherein the compensation contact is a pogo pin contact having one end secured to the printed circuit board and a second end in physical contact with an outlet contact.

5. A telecommunications connector comprising:
a plug having plug contacts;
an outlet having outlet contacts, the plug contacts making physical and electrical contact with the outlet contacts on a top surface of the outlet contacts;
a compensation contact positioned beneath a bottom surface of the outlet contacts, the compensation contact being proximate to a location where the plug contacts make physical contact with the outlet contacts, the compensation contact providing crosstalk compensation for the telecommunications connector;
wherein the compensation contact includes an arm extending from a first outlet contact, the arm passing under one or more outlet contacts, the compensation contact further including an extension off the arm, the extension passing under and parallel to a second outlet contact.

6. The telecommunications connector of claim 5 further comprising:
an insulative spacer between the arm and the outlet contacts and between the extension and the outlet contacts.

7. A telecommunications connector comprising:
a plug having plug contacts;
an outlet having outlet contacts, the plug contacts making physical and electrical contact with the outlet contacts on a top surface of the outlet contacts;
a compensation contact positioned beneath a bottom surface of the outlet contacts, the compensation contact being proximate to a location where the plug contacts make physical contact with the outlet contacts, the compensation contact providing crosstalk compensation for the telecommunications connector;
the outlet contacts and the compensation contact are physically supported on a printed circuit board in the outlet;
wherein the compensation contact makes direct physical and electrical contact with the outlet contact.

8. The telecommunications connector of claim 7 wherein:
the compensation contact is electrically connected to compensation elements on the printed circuit board.

9. A telecommunications connector comprising:

a plug having plug contacts;

an outlet having outlet contacts, the plug contacts making physical and electrical contact with the outlet contacts on a top surface of the outlet contacts;

a compensation contact positioned beneath a bottom surface of the outlet contacts, the compensation contact being proximate to a location where the plug contacts make physical contact with the outlet contacts, the compensation contact providing crosstalk compensation for the telecommunications connector;

wherein the outlet contacts and the compensation contact are physically supported on a printed circuit board in the outlet;

wherein the compensation contact is insulated and is reactively coupled to the outlet contact;

wherein the compensation contact provides compensation without additional compensation elements.

10. The telecommunications connector of claim 9 wherein:

the compensation contacts includes a plurality of compensation contacts extending from the printed circuit board and running parallel to respective outlet contacts.

11. The telecommunications connector of claim 10 further comprising:

an insulative sheet positioned between the outlet contacts and the compensation contacts.

\* \* \* \* \*